United States Patent
Gulani et al.

(10) Patent No.: US 12,196,831 B2
(45) Date of Patent: Jan. 14, 2025

(54) QUANTITATIVE REDUCED FIELD-OF-VIEW IMAGING SYSTEM USING 3D TAILORED INNER VOLUME EXCITATION AND PATTERN RECOGNITION

(71) Applicant: REGENTS OF THE UNIVERSITY OF MICHIGAN, Ann Arbor, MI (US)

(72) Inventors: Vikas Gulani, Ann Arbor, MI (US); Nicole Seiberlich, Ann Arbor, MI (US); Jon-Fredrik Nielsen, Huntington Woods, MI (US); Yun Jiang, Ann Arbor, MI (US)

(73) Assignee: REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 67 days.

(21) Appl. No.: 17/990,616

(22) Filed: Nov. 18, 2022

(65) Prior Publication Data
US 2024/0168116 A1    May 23, 2024

(51) Int. Cl.
*G01V 3/00*        (2006.01)
*G01R 33/50*       (2006.01)
(Continued)

(52) U.S. Cl.
CPC ......... *G01R 33/5608* (2013.01); *G01R 33/50* (2013.01); *G01R 33/543* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS

| | | | | |
|---|---|---|---|---|
| 9,445,722 | B2 * | 9/2016 | Blumhagen | A61B 5/0035 |
| 10,845,444 | B2 * | 11/2020 | Cohen | G01R 33/50 |
| 2018/0203082 | A1 * | 7/2018 | Griswold | G06F 16/5838 |

FOREIGN PATENT DOCUMENTS

| | | | | |
|---|---|---|---|---|
| CA | 2984843 A1 * | 5/2018 | ......... | A61B 18/1492 |
| DE | 60038156 T2 * | 3/2009 | ............... | A61B 8/08 |

(Continued)

OTHER PUBLICATIONS

Hao et al., Joint Design of Excitation k-Space Trajectory and RF Pulse for Small-Tip 3D Tailored Excitation in MRI, IEEE Trans Med Imaging, 35(2):468-479 (2016).

(Continued)

*Primary Examiner* — Walter L Lindsay, Jr.
*Assistant Examiner* — Frederick Wenderoth
(74) *Attorney, Agent, or Firm* — MARSHALL, GERSTEIN & BORUN LLP

(57) ABSTRACT

Methods and systems perform magnetic resonance fingerprinting (MRF) by obtaining magnetic resonance data over a main field-of-view (FOV) and resulting from providing a magnetic resonance fingerprinting pulse sequence to a sample. The pulse sequence includes gradient waveforms and radio frequency (RF) pulses that have pulse sequence parameters specifically tailored for scanning, not the entire main FOV but rather a reduced portion of that main FOV. The methods and systems further include comparing the magnetic resonance data from the sample to a fingerprint dictionary of signal profiles that specifically correspond to the reduced portion of the main FOV and generating tissue property maps that correspond only to that reduced portion.

18 Claims, 7 Drawing Sheets
(2 of 7 Drawing Sheet(s) Filed in Color)

(51) Int. Cl.
*G01R 33/54* (2006.01)
*G01R 33/56* (2006.01)

(58) Field of Classification Search
USPC .......................................... 324/309
See application file for complete search history.

(56) References Cited

FOREIGN PATENT DOCUMENTS

| JP | 2019042053 A | * | 3/2019 |
| JP | 2019534748 A | * | 12/2019 |

OTHER PUBLICATIONS

Luo et al., Joint Design of RF and Gradient Waveforms via Auto-differentiation for 3D Tailored Excitation in MRI, IEEE Trans. Med. Imaging, 40(12):3305-3314 (2021).
Ma et al., Magnetic resonance fingerprinting, Nature, 495(7440):187-192 (2013).

* cited by examiner

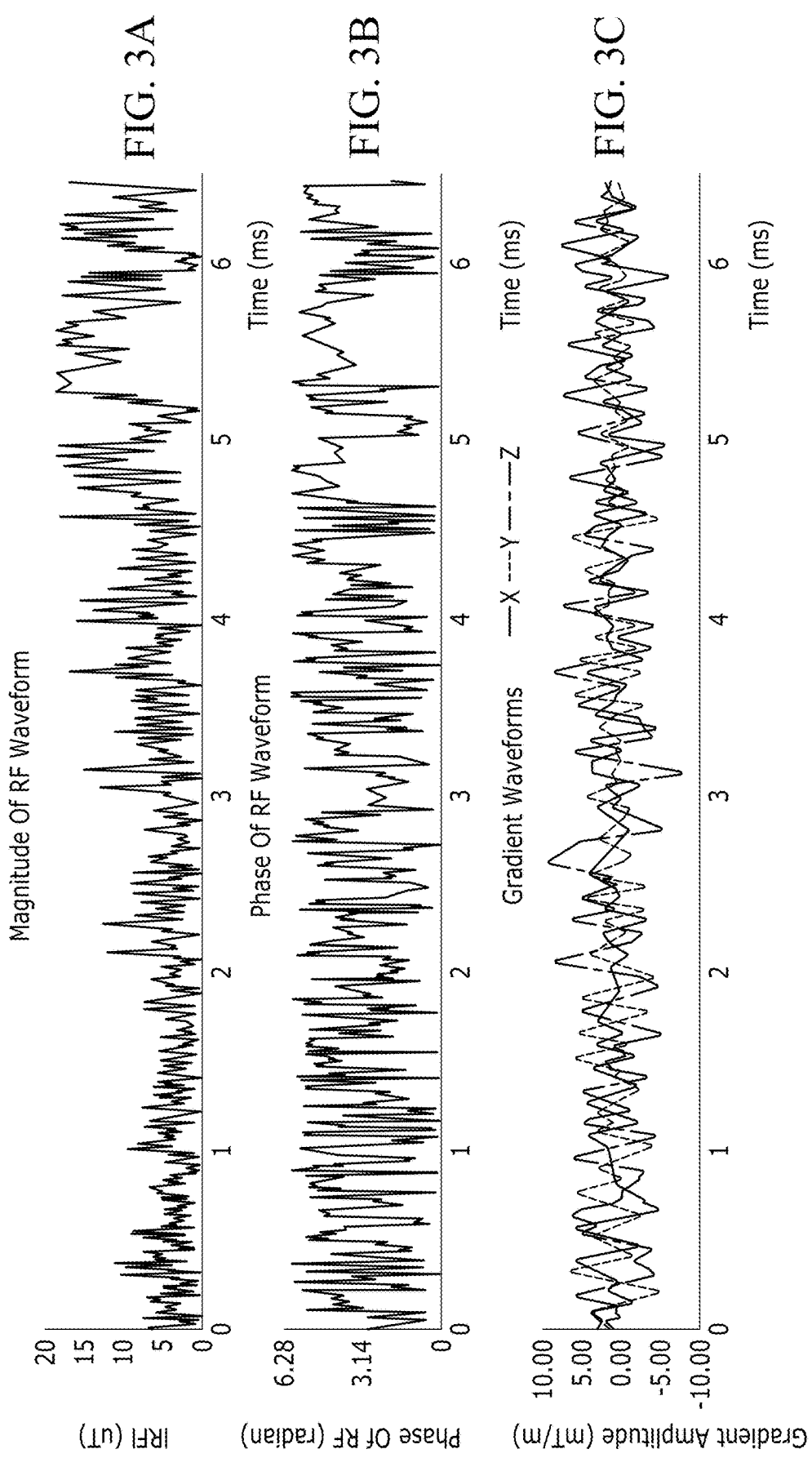

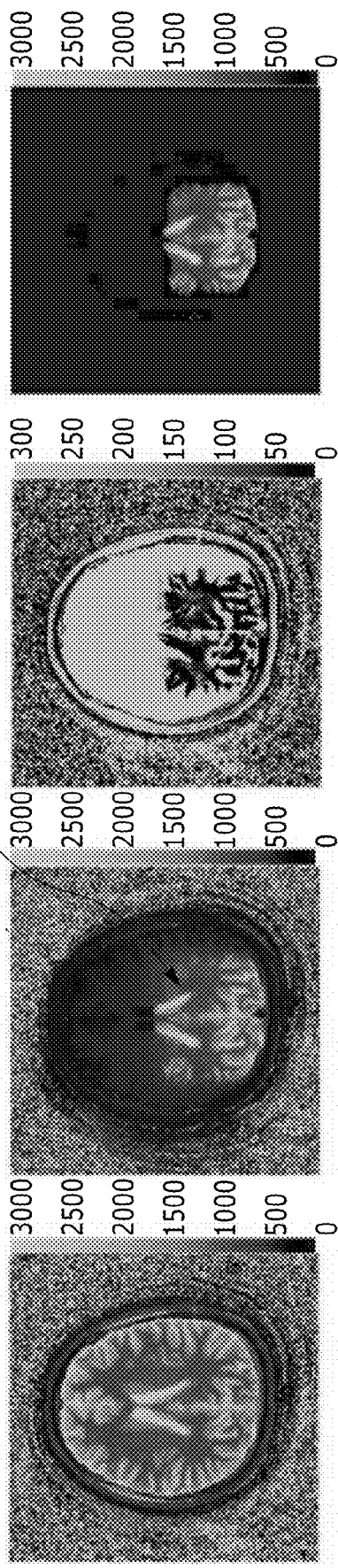
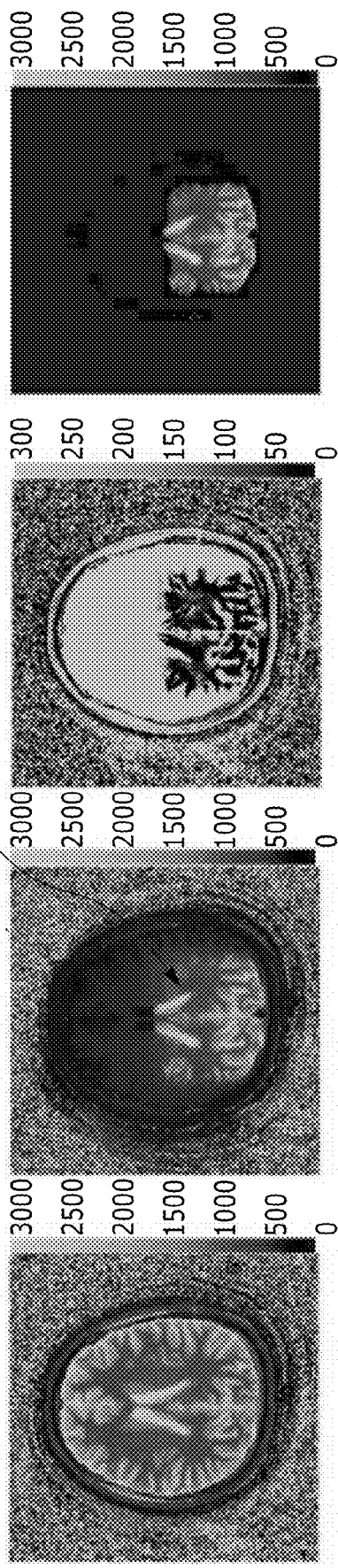
FIG. 5A  FIG. 5B  FIG. 5C  FIG. 5D
FIG. 5E  FIG. 5F  FIG. 5G  FIG. 5H

US 12,196,831 B2

QUANTITATIVE REDUCED FIELD-OF-VIEW IMAGING SYSTEM USING 3D TAILORED INNER VOLUME EXCITATION AND PATTERN RECOGNITION

STATEMENT OF GOVERNMENT SUPPORT

This invention was made with government support under CA208236 and CA263583 awarded by the National Institutes of Health. The government has certain rights in the invention.

FIELD OF THE DISCLOSURE

The invention generally relates to magnetic resonance fingerprinting techniques and, more particularly, to generating quantitative tissue property maps over a reduced field-of-view (FOV) from tailored inner volume (IV) excitation and pattern recognition using magnetic resonance fingerprinting techniques.

BACKGROUND

The background description provided herein is for the purpose of generally presenting the context of the disclosure. Work of the presently named inventor, to the extent it is described in this background section, as well as aspects of the description that may not otherwise qualify as prior art at the time of filing, are neither expressly nor impliedly admitted as prior art against the present disclosure.

Magnetic resonance fingerprinting (MRF) is an imaging technique that yields quantitative maps of multiple tissue properties from a single rapid acquisition. Typically, high-resolution property maps require acquisition patterns that collect high spatial resolution data, or a larger extent of k-space. These acquisition patterns require more data sampling time, thereby extending the scan time. However, the individual images used for MRF contain only a fraction of the total k-space data and, therefore, high spatial resolution data may not need to be acquired at every time point to enable higher resolution mapping.

While MRF is a useful and proven technique, there is a need for capturing MRF imaging data more efficiently and in particularly with respect to key regions of interest in a sample.

SUMMARY OF THE INVENTION

The present techniques provide systems and methods of quantitative reduced field-of-view imaging system using magnetic resonance fingerprinting (MRF), in particularly using tailored excitations and pattern recognition. In some examples, the present techniques achieve reduced field-of-view (FOV) tissue property mapping, e.g., $T_1$ and $T_2$ mapping, through use of a three-dimensional (3D) tailored inner volume (IV) excitation and region specific MRF dictionary pattern recognition. In various examples, reduced FOV imaging is achieved using a localized, inner volume excitation that is able to reduce acquisition time and increase spatial resolution by reducing the encoding burden associated with a full field-of-view image data.

In an aspect, a method for performing magnetic resonance fingerprinting (MRF) includes: obtaining, using a magnetic resonance scanning device, a first magnetic resonance data over a main field-of-view and resulting from provision of a first magnetic resonance fingerprinting pulse sequence to a sample, the first magnetic resonance fingerprinting pulse comprising a first radio frequency (RF) pulse and gradient waveform pair; obtaining, using the magnetic resonance scanning device, a second magnetic resonance data over the main field-of-view and resulting from provision of a second magnetic resonance fingerprinting pulse sequence comprising a second RF pulse and gradient waveform pair having different pulse sequence parameters compared to the first magnetic resonance fingerprinting pulse; comparing, using the magnetic resonance scanning device, the first magnetic resonance data and the second magnetic resonance data to a fingerprint dictionary of signal profiles corresponding to a reduced field-of-view forming a subset of the main field-of-view; and responsive to the comparison, generating, using the magnetic resonance scanning device, high-resolution tissue property maps of the portion of the sample corresponding to the reduced field-of-view.

In an aspect, the different pulse sequence parameters comprise different RF pulse parameters selected from the group consisting of flip angles, RF pulse magnitude, RF pulse phase, RF pulse waveform, and gradient waveform.

In an aspect, generating high-resolution tissue property maps of the portion of the sample corresponding to the reduced field-of-view comprises generating a $T_1$ tissue property map and a $T_2$ tissue property map corresponding to the reduced field-of-view.

In an aspect, the method includes: comparing, using the magnetic resonance scanning device, the first magnetic resonance data and the second magnetic resonance data to a fingerprint dictionary of signal profiles corresponding to a region of the main field-of-view outside of the reduced field-of-view; and responsive to the comparison, generating, using the magnetic resonance scanning device, high-resolution tissue property maps of the portion of the sample corresponding to the region of the main field-of-view outside of the reduced field-of-view.

In an aspect, generating high-resolution tissue property maps of the portion of the sample corresponding to the region of the main field-of-view outside of the reduced field-of-view comprises generating $T_1$ tissue property maps and $T_2$ tissue property maps corresponding to the corresponding to the region of the main field-of-view outside of the reduced field-of-view.

In an aspect, the method includes applying, using the magnetic resonance scanning device, the first magnetic resonance fingerprinting pulse sequence to the sample to affect acquiring the sequence of first magnetic resonance data; and applying, using the magnetic resonance scanning device, the second magnetic resonance fingerprinting pulse sequence to the sample to affect acquiring the sequence of second magnetic resonance data.

In an aspect, the method includes obtaining an identification of the reduced field-of-view of the main field-of-view from analysis of previously-obtained data corresponding to the main field-of-view.

In an aspect, the method includes displaying a visual indication of the main field-of-view of the sample to a user; and obtaining, from the user, an identification of the reduced field-of-view of the main field-of-view.

In another aspect, a non-transitory computer-readable storage medium storing executable instructions that, when executed by a processor, cause a computer to: obtain, using a magnetic resonance scanning device, a first magnetic resonance data over a main field-of-view and resulting from provision of a first magnetic resonance fingerprinting pulse sequence to a sample, the first magnetic resonance fingerprinting pulse comprising a first radio frequency (RF) pulse and gradient waveform pair; obtain, using the magnetic resonance scanning device, a second magnetic resonance data over the main field-of-view and resulting from provision of a second magnetic resonance fingerprinting pulse sequence comprising a second RF pulse and gradient waveform pair having different pulse sequence parameters compared to the first magnetic resonance fingerprinting pulse; compare, using the magnetic resonance scanning device, the first magnetic resonance data and the second magnetic resonance data to a fingerprint dictionary of signal profiles corresponding to a reduced field-of-view forming a subset of the main field-of-view; and responsive to the comparison, generate, using the magnetic resonance scanning device, high-resolution tissue property maps of the portion of the sample corresponding to the reduced field-of-view.

In an aspect, the different pulse sequence parameters comprise different RF pulse parameters selected from the group consisting of flip angles, RF pulse magnitude, RF pulse phase, RF pulse waveform, and gradient waveform.

In an aspect, the computer-readable storage medium stores executable instructions that, when executed by a processor, cause a computer to generate the high-resolution tissue property maps of the portion of the sample corresponding to the reduced field-of-view as a $T_1$ tissue property map and a $T_2$ tissue property map corresponding to the reduced field-of-view In an aspect, the computer-readable storage medium stores executable instructions that, when executed by a processor, cause a computer to compare, using the magnetic resonance scanning device, the first magnetic resonance data and the second magnetic resonance data to a fingerprint dictionary of signal profiles corresponding to a region of the main field-of-view outside of the reduced field-of-view; and responsive to the comparison, generate, using the magnetic resonance scanning device, high-resolution tissue property maps of the portion of the sample corresponding to the region of the main field-of-view outside of the reduced field-of-view.

In an aspect, the high-resolution tissue property maps of the portion of the sample corresponding to the region of the main field-of-view outside of the reduced field-of-view comprise a $T_1$ tissue property map and a $T_2$ tissue property map corresponding to the corresponding to the region of the main field-of-view outside of the reduced field-of-view.

In an aspect, the computer-readable storage medium stores executable instructions that, when executed by a processor, cause a computer to apply, using the magnetic resonance scanning device, the first magnetic resonance fingerprinting pulse sequence to the sample to affect acquiring the sequence of first magnetic resonance data; and apply, using the magnetic resonance scanning device, the second magnetic resonance fingerprinting pulse sequence to the sample to affect acquiring the sequence of second magnetic resonance data.

In an aspect, the computer-readable storage medium stores executable instructions that, when executed by a processor, cause a computer to obtain an identification of the reduced field-of-view of the main field-of-view from analysis of previously-obtained data corresponding to the main field-of-view.

In an aspect, the computer-readable storage medium stores executable instructions that, when executed by a processor, cause a computer to display a visual indication of the main field-of-view of the sample to a user; and obtain, from the user, an identification of the reduced field-of-view of the main field-of-view.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The figures described below depict various aspects of the system and methods disclosed herein. It should be understood that each figure depicts an embodiment of a particular aspect of the disclosed system and methods, and that each of the figures is intended to accord with a possible embodiment thereof. Further, wherever possible, the following description refers to the reference numerals included in the following figures, in which features depicted in multiple figures are designated with consistent reference numerals.

FIGS. 3A and 3B are plots of magnitude and phase (respectively) of a tailored RF pulse for scanning a reduced FOV along with a gradient waveform shown in FIG. 3C, in accordance with an example herein.

FIGS. 5A-5D are tissue maps for $T_1$ tissue property and FIGS. 5E-5H are tissue maps for $T_2$ tissue property under different conditions, in accordance with an example. FIGS. 5A and 5E are $T_1$ and $T_2$ maps (respectively) excited with normal full FOV RF pulses. FIGS. 5B and 5F are $T_1$ and $T_2$ maps (respectively) excited with the 3D tailored RF pulses corresponding to a reduced FOV. FIGS. 5C and 5G are $T_1$ and $T_2$ difference maps (respectively). FIGS. 5D and 5H are $T_1$ and $T_2$ maps that have been masked and applied with a threshold.

DETAILED DESCRIPTION

Figure 1A:
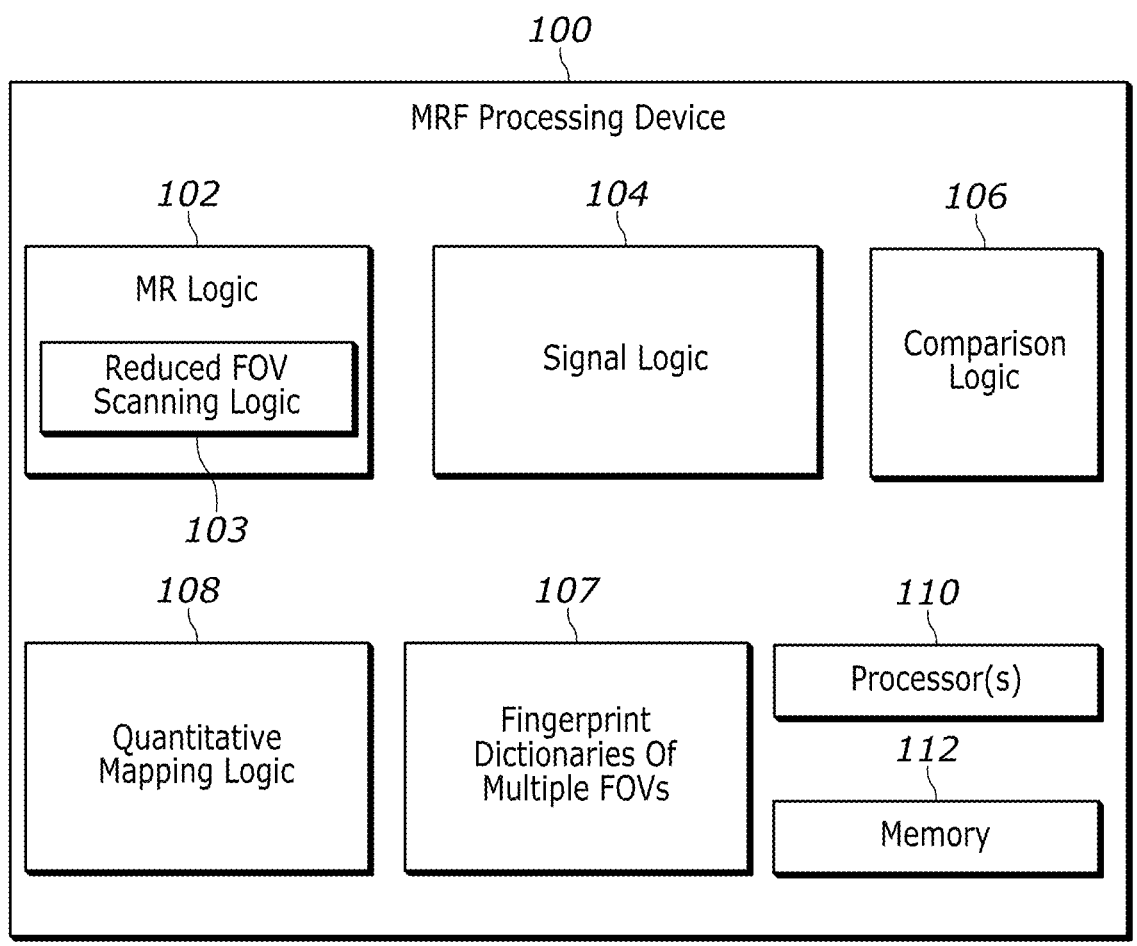
FIG. 1A illustrates an example multiresolution magnetic resonance fingerprinting (MRF) processing device for performing reduced field-of-view (FOV) imaging analysis, in accordance with an example herein.

The present techniques provide quantitative reduced field-of-view (FOV) imaging systems and methods using magnetic resonance fingerprinting (MRF), in particular using tailored excitations and pattern recognition to assess tissue properties in the reduced FOV. The reduced FOV represents a sub-portion of the main FOV undergoing MRF scanning, where that sub-portion may be a sub-volume of an entire scanned volume. In some examples, the present techniques achieve reduced FOV tissue property mapping, e.g., $T_1$ and $T_2$ mapping, through use of a three-dimensional (3D) tailored inner volume (IV) excitation and region specific MRF dictionary pattern recognition. The resulting reduced FOV imaging uses a localized, inner volume excitation and is able to reduce acquisition time and increase spatial resolution by reducing the encoding burden associated with a full field-of-view image data.

In an embodiment, the present techniques include systems and methods for performing magnetic resonance fingerprinting (MRF) that include obtaining, using a magnetic resonance scanning device, magnetic resonance data over one or more FOVs resulting from one or more magnetic resonance fingerprinting pulse sequences. In some examples, magnetic resonance data is obtained over a main FOV and results from a first magnetic resonance fingerprinting pulse sequence and additional magnetic resonance data is obtained over a reduced FOV resulting a further magnetic resonance fingerprinting pulse sequence that has altered pulse sequence parameters compared to the first pulse sequence. For example, those altered pulse sequence parameters may be chosen so that the further pulse sequence corresponds to the reduced FOV.

Collected over both the main FOV and the reduced FOV the obtained magnetic resonance data is applied to a fingerprint dictionary of signal profiles. In particular, the magnetic resonance data is applied to a fingerprint dictionary that corresponds to the reduced FOV. For example, the fingerprint dictionary of signal profiles may represent magnetic resonance fingerprint dictionaries that are predetermined to correspond specifically to the reduced FOV region. From comparison to the fingerprint dictionary, the magnetic resonance scanning device is able to generate high-resolution tissue property maps of the portion of the sample corresponding to the reduced FOV, e.g., $T_1$ and $T_2$ tissue maps.

As previously mentioned, conventional MRF techniques may be able to generate high-resolution property maps while scanning over a fraction of the total k-space data and using only a single scan. However, capturing MRF imaging data is more time consuming than is often necessary, when considering that the tissue of interest is often only over a portion of the entire region imaged. That is, with conventional MRF techniques the entire captured MRF signal data is compared against fingerprint dictionaries in order to map the entire image space, that is, the entire FOV.

It is an objective of the present disclosure to overcome these limitations by providing specific MRF analysis, not over an entire FOV using a single scan, but rather to perform MRF analysis over one or more reduced fields of view, each scanned using a pulse sequence with pulse sequence parameters that are specific to the reduced FOV and thus specific to a particular region of interest. The pulses for scanning each reduced FOV have properties that are altered from those of the pulses that scan the entire FOV. In these ways, the present disclosure offers improvements in MRF imaging techniques, including improved pulse scanning that allows for differentiating regions of interest in a scanned tissue sample while also offering the ability to more quickly scan the most desired portions of the tissue sample. In particular, in some examples, these improvements are achieved by using altered pulse sequence parameters, in particular, RF pulse parameters, for different regions of interest. A first set of pulse parameters may be used for a first region of interest, a second set of pulse parameters may be used for a second region of interest, and that process may continue for all regions of interest. The altered pulse parameters are parameters that map to different fingerprint dictionaries, that is, properties that allow for fingerprint dictionaries that provide signal patterns that can distinguish between different regions of interest in a tissue sample. Example pulse parameters include RF pulse parameters, such as flip angles, RF magnitude, RF phase, RF waveform, and gradient waveform. As a result, the present disclosure is able to generate tissue maps over different regions of a tissue sample, including over only a reduced FOV portion of image data, more efficiently and without a loss of image quality. The present techniques for example may allow for advantageous MRF scanning of an inner volume of a region of interest using different scan parameters for tissue map generation than that used for an outer volume surrounding the region of interest.

FIG. 1A illustrates an MRF processing device 100, for example, as may be used to control using a magnetic resonance scanning device to analyze MR images, in accordance with various techniques herein. The MRF processing device 100 includes one or more logic modules 102, 104, 106, 108, and/or 110, and that represents an implementation of the MRF acquisition system 102. Depending on the implementation, the logic modules 102, 104, 106, 108, and/or 110 may be implemented in the MRF processing device 100 as hardware, software, firmware, or some combination of such. MRF processing device 100 simultaneously quantifies MR parameters including $T_1$, $T_2$, and proton density for an object to which the MRF processing device 100 applies an MRF pulse sequence. In various embodiments, the MRF processing device 100 provides an MR image that facilitates identifying certain tissues based on their relative hypo-intense or hyper-intense appearance on an MR image (e.g., $T_1$ weighted image, $T_2$ weighted image).

MRF processing device 100 includes a MR logic module 102. The MR logic module 102 controls operation of the magnetic resonance scanning device to repetitively and variably sample an object (e.g., a tissue region of a subject) in a (k, t, E) space to acquire a set of MR signals that may have non-constant amplitude and/or phase. For the (k, t, E) space, the k may be a point in k-space representing a spatial frequency of an MR image. In some implementations, the MR logic 102 may determine the value of k based on a Fourier Transform (FT) of the MR image. The t in the (k, t, E) space represents time, and the E represents one or more MR parameters for the MR image in question. Members of the set of MR signals are associated with different points in the (k, t, E) space. In different examples, the different points are sampled according to a plan where t and/or E varies non-linearly and/or in a non-constant manner.

The MR logic module 102 controls sampling of the object using an MR pulse sequence containing a plurality of variable sequence blocks. Each sequence block contains an excitation phase, a readout phase, and a waiting phase, and the duration of the sequence block is referred to as the repetition time (TR). A different sequence block may be performed for the main FOV and each reduced FOV. The excitation phase applies radiofrequency (RF) energy and a gradient waveform magnetic field to a volume of one or more resonant species. The readout phase samples the signal resulting from the excitation phase simultaneously for all resonant species. The waiting phase is a pause before the beginning of the next sequence blocks.

Figure 1B:
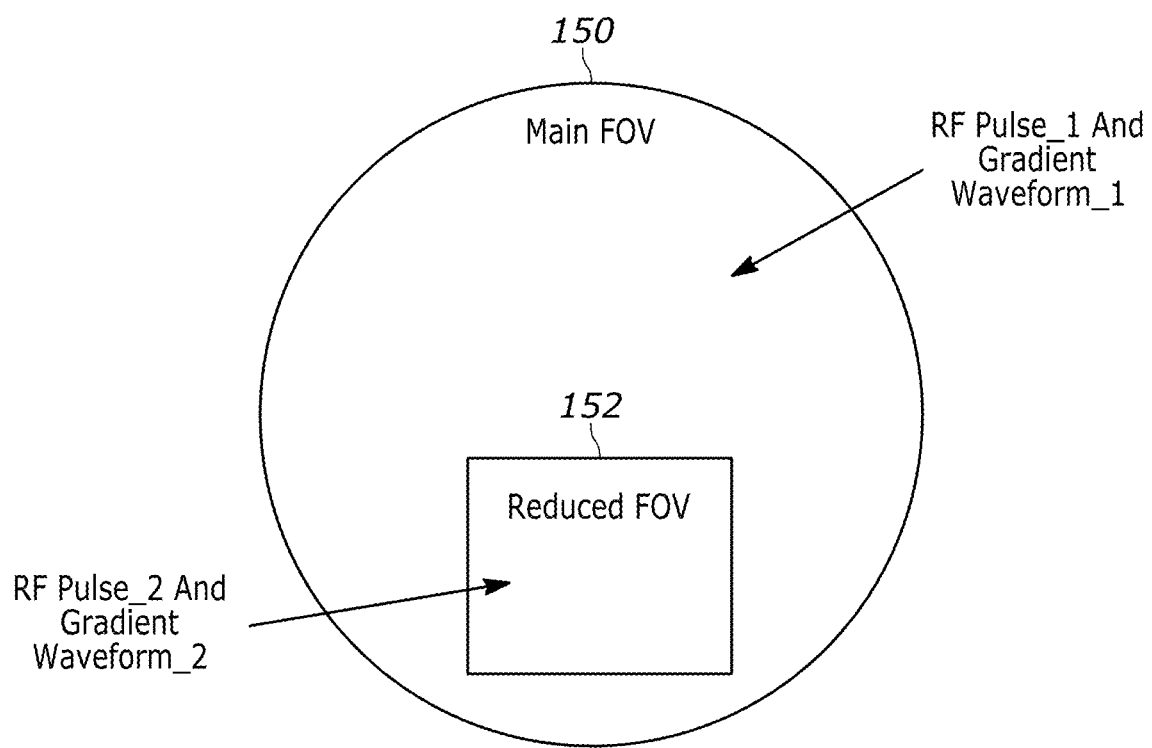
FIG. 1B illustrates a main FOV and a reduced FOV as scanned by the MRF processing device of FIG. 1A, in accordance with an example herein.

The MR logic module 102 includes reduced FOV scanning logic 103 that is configured to apply RF energy pulses and gradient waveform pairs, having different pulse sequence parameters, to different reduced FOV compared to a main FOV of the entire MRI imaging system that is also scanned by the MR logic 102. In some examples, the reduced FOV logic 103 is configured to generate a RF pulse and gradient waveform pair tailored to scan a reduced FOV. In some examples, the logic 103 is configured to generate multiple RF pulse and gradient waveform pairs, each with different sequence parameters and each corresponding to scanning a different portion of the main FOV, e.g., scanning multiple different reduced FOVs. Each of the different RF pulse and gradient waveform pairs may be provided in a single sequencing block in some examples. In other examples, each RF pulse and gradient waveform pair may be applied in a different sequencing block, with its own excitation and readout phases, e.g., to allow for different resolution and sampling patterns during the readout phases of each pulse sequence block. For example, each RF pulse in a sequence block may excite a different region-of-interest, and each sequence block may have a unique readout phase according to the region that the RF pulse excites. All sequence blocks (or RF pulses for all sequence blocks) have a common region that the MRF sequence is interested in getting $T_1$ and $T_2$ maps. That is, the reduced FOV scanning logic 103 can vary the RF pulses and readout for each sequence block. In some examples, the reduced FOV scanning logic 103 is configured to control the magnetic resonance scanning device to apply a magnetic resonance fingerprinting pulse sequences having different pulse sequence parameters, such as different flip angles, RF pulse magnitudes, RF pulse phases, RF pulse waveforms, and/or gradient waveforms. FIG. 1B illustrates a portion of a tissue under examination, showing a main FOV 150 for the MRF processing device 100 and a reduced FOV 152, the former having a first RF pulse sequence and gradient waveform pair, the later having a second, different RF pulse sequence and gradient waveform pair. In particular, the RF pulse sequence and gradient waveform pair for the main FOV 150 may be a pair that is provided to only that portion of the main FOV 150 that is outside the reduced FOV 152. Therefore, descriptions herein to scanning a main FOV, comparing to a main FOV, determining a RF pulse sequence and gradient waveform pair, etc. include, in various examples, that portion of the main FOV that is outside of the reduced FOV.

In the illustrated example, the MRF processing device 100 also includes a signal logic module 104. Signal logic module 104 produces an MR signal evolution from the acquired MR signals from the MR logic 102. The signal evolution may include a number of MR signals acquired over a period of time. The set of MR signals may include transient-state signals associated with the MRF pulse sequence, a free induction decay signal, and a spin echo signal. The comparison logic module 106 compares reference information (e.g., stored in the memory 112 or in the comparison logic 106) with the produced MR signal evolution or information associated with the produced MR signal evolution. In some implementations, the comparison logic module 106 determines whether a match exists between signals included in the reference information and at least one of the produced MR signal evolution or information associated with the produced MR signal evolution based on whether the comparison logic module 106 determines there to be an exact match. In various examples, the reference information includes fingerprint dictionaries of signal profiles and more specifically fingerprint dictionaries 107 corresponding to each regions of interest in a sample, such as at one or more reduced FOVs of the main FOV of the magnetic resonance scanning device. These fingerprint dictionaries may be determined based on the pulse sequences generated by the reduced FOV scanning logic 103, for example. Fingerprint dictionaries may be determined by the parameters of the pulse sequences, i.e., RF magnitude, RF phase, flip angle, repetition time, echo time, etc. The same formulation may be used to determine fingerprint dictionaries for each of the inner and out volumes. However, dictionaries of inner volume(s) will be different in the signal amplitude and phase compared to the signal (dictionary) of the outer volume or to the signal of other inner volumes due to differences in the RF and gradient waveforms of the inner volume RF excitation, for example.

In other implementations, an exact match is not necessary, and the comparison logic module 106 may determine that there exists a match where measured signals are similar to the reference information. Depending on the implementation, a match may be the signal that most closely matches another signal and/or the first signal that matches another signal to within a threshold. A match may be found by template matching, pattern matching, or other comparison approaches. The reference information may be, for example, a previously acquired signal evolution, a simulated signal evolution, an item derived from a signal evolution other than the produced MR signal evolution, and/or any other similar information. The reference information may include signal evolutions from different tissue types (e.g., healthy, diseased, advanced disease, etc.).

To generate MRF tissue maps, the MRF processing device 100 also includes the quantitative mapping logic module 108 configured to generate, from the magnetic resonance data captured at MR logic 102, high-resolution tissue property maps of the sample, in accordance with techniques herein. The quantitative mapping logic module 108 may produce one or more quantitative maps of tissue properties associated with the object being scanned, for example, quantitative maps for $T_1$, $T_2$, proton density, and diffusion, based at least in part on the stored signal evolution that matches the MR signal evolution. In particular, the quantitative mapping logic 108 may be configured to generate different quantitative maps for different regions of interest, such as one or more reduced FOVs each corresponding to the reduced FOVs of the scanning logic 103.

The MR parameters may be retrieved from a data store that links stored MR parameters to the reference information, which may be in the form of fingerprint dictionaries 107 and in particular dictionaries of signal values corresponding to different reduced FOVs. Quantitative mapping logic module 108 may also display the quantitative maps or cause the quantitative maps to be displayed. In some examples, multiple tissue property maps are generated simultaneously by the module 108.

Figure 2:
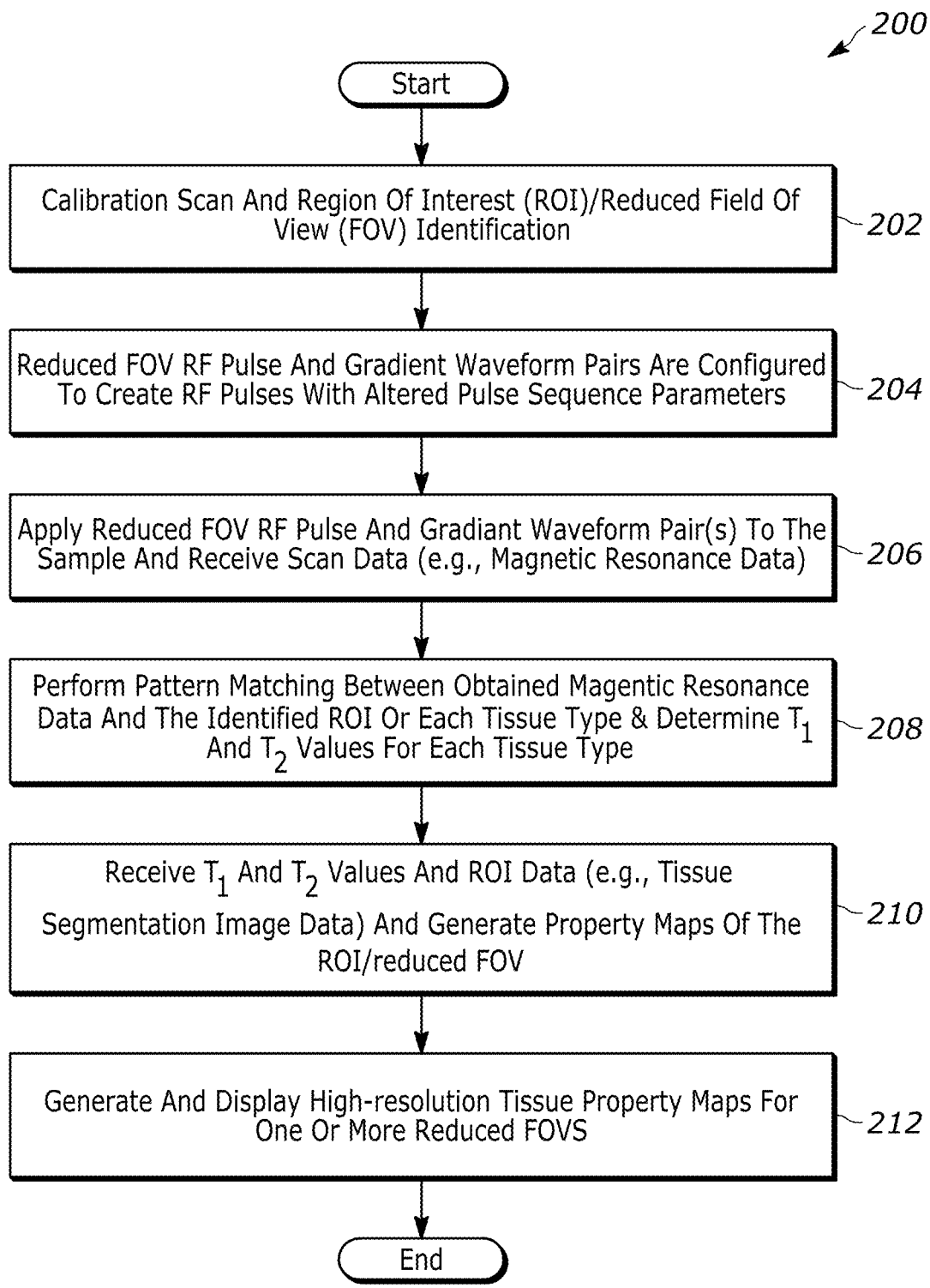
FIG. 2 illustrates an example process for performing magnetic resonance fingerprinting (MRF) that includes reduced field-of-view (FOV) imaging analysis and tissue property map generation using tailored RF pulses, in accordance with an example herein.

FIG. 2 illustrates an example method 200 for performing magnetic resonance fingerprinting, in an example. At a block 202, calibration scans and sample region of interest (ROI) identification are performed using a magnetic resonance scanning device. For example, calibration scans of a sample may be performed using a MRF device, and the resulting scan data may be analyzed and displayed to an operator for the MRF. The result is the display of a main field-of-view. The operator may then identify a region of interest within that main field-of-view (FOV). This ROI may be determined from an input selection from the operator, e.g., interfacing with a touchscreen display, keypad, or other input device. The ROI/reduced FOV may be adjusted based on the position of the subject, the organ of interest (e.g., the brain, prostate, or heart) and/or based on the desired spatial resolution and desired imaging speed. Generally, the ROI will correspond to a portion of the displayed image data, that is, to reduced FOV of the main FOV containing the entire image data. In some examples, multiple different ROIs may be manually identified by an operator, each being a reduced FOV and each stored via the block 202. In some examples, the operator may identify one or more reduced FOVs, and the block 202 may correspondingly segment out the reduced FOV(s) and treat any remaining portion of the main FOV not identified, as a support reduced FOV. For example, an operator may identify a single reduced FOV corresponding to an inner volume of an image data, and the block 202 may identify an outer volume of the image data surrounding that reduced FOV as a second reduced FOV corresponding to the rest of the main FOV that is outside the identified inner volume. In some examples, the one or more reduced FOVs are identified automatically within a main FOV. For example, at the block 202, an MRF device may access previously determined reduced FOVs stored in a memory, and the block 202 may visually indicate these using bounding boxes or other visual outlines on a display of image data requesting the operator confirm that each indicated region(s) corresponds to a desired reduced FOV. The reduced FOVs may be stored based on pixel position within a main FOV, for example.

With one or more reduced FOVs identified at block 202, at a block 204 RF pulses and gradient waveform pairs are configured each with different pulse sequence parameters from one another, and each desired to scan a different portion of the main FOV. In some examples, the block 204 configures RF pulse sequences to differ from one another in at least one of the following example pulse sequence parameters: flip angle, RF pulse magnitude, RF pulse phase, and/or RF pulse waveform. In some examples, the gradient waveform differs for different regions of interest. In some examples, both the RF pulse sequence and gradient waveform are different for each FOV/region of interest. The pulse sequence parameters for the reduced FOV may be determined by the location (locations) of the reduced FOV (FOVs), such as the location of reduced FOV 152 in the main FOV 150 and the locations of multiple rFOVs. The pulse sequence parameters for each region of interest (rFOVs and the main FOV) are chosen to create distinguishable signals, so that post-processing can separate each region. The block 204, for example, may generate different RF pulses for scanning an inner volume corresponding to a reduced FOV and an outer volume corresponding to remainder of the main FOV, outside of the reduced FOV. Thus, with the process 200, a magnetic resonance scanning device (e.g., an MRF device) is able to facilitate reduced FOV imaging using a localized, inner volume excitation can be used to reduce acquisition time and increase spatial resolution by reducing the FOV encoding burden. Using signal encoding and pattern recognition from MRF, it is possible to impart signals from the inner volume and the outer volume (or multiple reduced FOVs more generally) with distinguishable signal evolutions by exciting them with different flip angles and RF phases, for example. Then, by matching the signals from both volumes to the pre-calculated dictionary containing expected signals, improved reduced FOV quantitative mapping can be achieved in a reduced scan time.

At a block 206, the MRF device performs an MRF scan process, by applying the configured RF pulses and gradient waveform to the sample, in particular, the respective regions of the main FOV. In some examples, each of the RF pulse sequence and gradient waveform pair are applied to scan their respective regions of the sample, such that the entire main FOV is eventually scanned. In some examples, only a single RF pulse sequence and gradient waveform pair is applied and to the reduced FOV. This example may be used when it is desired to generate tissue maps corresponding only to the ROI of the reduced FOV and the fingerprinting dictionary is sufficiently distinctive to allow for tissue mapping the reduced FOV without having to include, via comparison, magnetic resonance data from the main FOV or from the region outside the reduced FOV. In any event examples, in some examples, scan data (e.g., magnetic resonance data) is obtained over each reduced FOV. In yet further examples, scan data may be additionally captured over the main FOV.

The process 200, at a block 208, applies the scan data to signal profile patterns for matching the scan data to a profile. In particular, the scan data corresponding to each RF pulse sequence and gradient waveform pair may be compared to different signal profile pattern each pattern corresponding to a different reduced FOV, thereby allowing for region specific pattern comparisons. For example, magnetic resonance data from an RF pulse having pulse sequence parameters chosen to scan an inner, reduced FOV may be compared against a fingerprint dictionary of signal profiles corresponding to that reduced FOV. The patterns may be region specific and tissue specific, and from the comparisons, tissue map data is generated according to magnetic resonance fingerprinting techniques, e.g., to determine $T_1$ and $T_2$ values for a corresponding reduced FOV.

At a block 210, the process 200 receives the reduced FOV data identifying each of the reduced FOVs and/or ROI data identifying the ROI. If there are several reduced FOVs or multiple ROIs that may be segmented from one another in the tissue map image data in forming the FOV or ROI mage data. In addition to the FOV image data, the block 210 receives the computed $T_1$ and $T_2$ values from the MRF acquisition, which are used to determine the different sequence parameters, per simulator models. At a process 212, these sequence parameters are used to generate the tissue maps for each FOV or ROI.

While comparison logic module 106 and quantitative logic module 108 are illustrated as being part of MRF processing device 100, in some examples, the comparison logic module 106 and quantitative mapping logic module 108 may reside in an apparatus separate from the MRF processing device 100. In such examples, MRF processing device 100 may provide MR signals to the separate apparatus housing comparison logic module 106 or quantitative mapping logic module 108. In further examples, comparison logic module 106 and/or quantitative mapping logic module 108 may reside in separate apparatuses.

While shown as separate logic modules 102-108, each of which may be implemented in hardware having one or more processors and memory, in some examples, the MRF processing device 100 is implemented having one or more processors 110 that may implement the operation of the logic modules 102-108. Further the processing device 100 may have a computer-readable memory 112 having instructions that may be executed by the one or more processors 112 and/or logic modules 102-108 to perform the methods and processes described herein.

Example

In an example implementation of the processing device 100, a 3D inner volume inversion pulse (IV pulse) was designed to excite a reduced three-dimensional (3D) FOV 80*80*50 mm$^3$ region using the auto-differentiable Bloch simulation approach implemented in Pytorch. RF and gradient waveforms were initialized using the extended kt-points method with a dwell time of 10 ms. The optimization was performed on a 32×32×30 voxel grid with a FOV of 400×400×155 mm$^3$ using a B$_0$ map acquired in the brain of a healthy subject. A B$_0$ field map was acquired with a spoiled gradient echo sequence with delta echo time of 0.5 ms. The optimization of the RF and gradient waveforms were constrained to respect the scanner hardware limitations (peak B$_1$ of 20 mT, peak gradient strength of 15 mT/m, and peak slew rate of 170 mT/m/ms). The designed (reduced FOV) RF pulse was inserted into a gradient-echo spoiled sequence that acquired 1000 time points with sinusoidally varying flip angles from 5°~55° following the IV inversion pulse. Each time point was acquired using one interleave of a uniform density spiral which required 48 interleaves to fully sample the 400×400 matrix. The acquisition time for one slice is 12 seconds. All acquired image data were reconstructed using non-uniform fast Fourier transform (NUFFT).

A dictionary was simulated using the Bloch equation based on the acquisition parameters with a range of $T_1$ (20~5000 ms) and $T_2$ (10~500 ms) values. A pattern-matching algorithm was applied to match the acquired signal (i.e., magnetic resonance data) to the dictionary. All studies were performed on a 3T scanner (MAGNETOM Vida, Siemens AG Healthcare, Erlangen, Germany). Both standard MRF data and MRF with the IV pulse for reduced FOV mapping were collected in a healthy subject.

FIGS. 3A, 3B, and 3C illustrate an example of the designed RF and gradient waveforms. FIG. 3A illustrates an amplitude of the RF pulse used for scanning the reduced FOV. FIG. 3B illustrates the phase of the RF pulse. FIG. 3C illustrates the gradient waveform. The duration of the RF pulse used to excite the reduced FOV, specifically the 80*80*50 $mm^3$ region of interest within the larger main FOV 400×400×155 $mm^3$, was 6.45 ms.

Figures 4A, 4B, 4C, 4D:
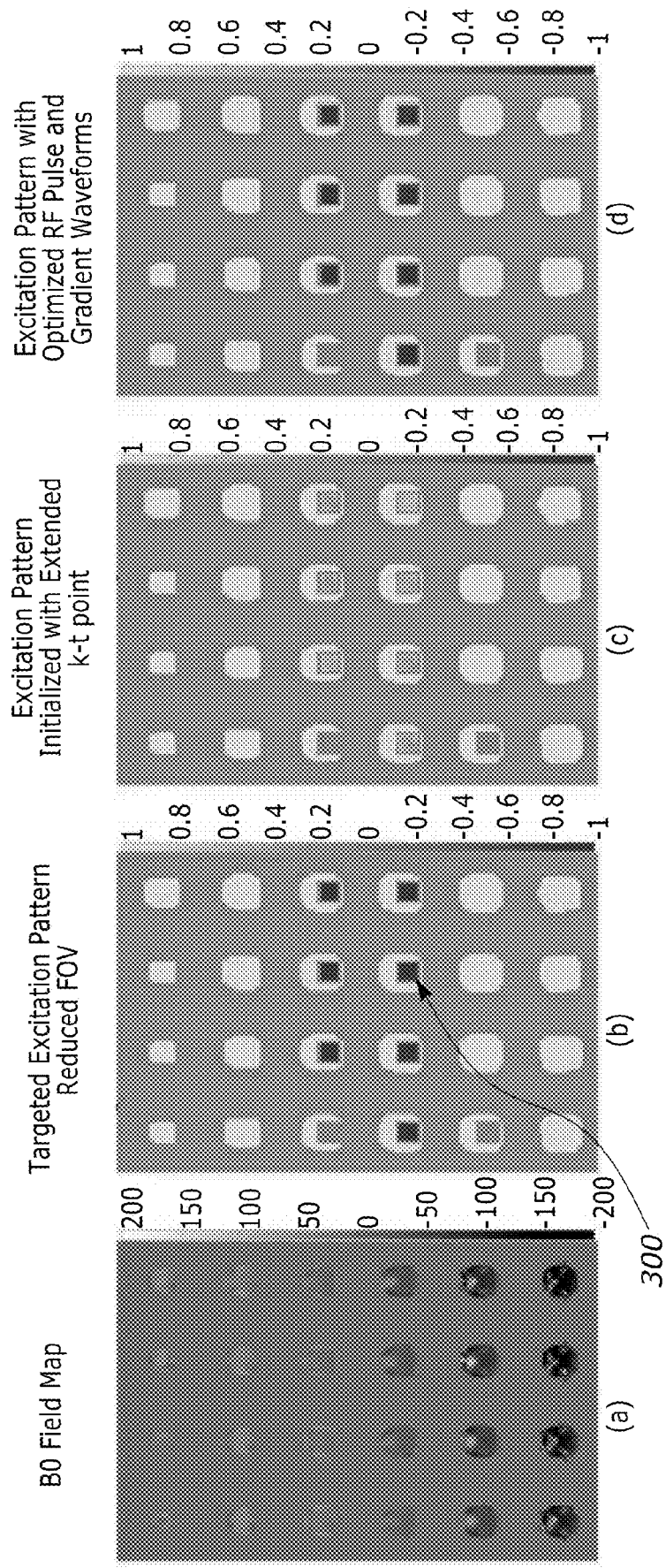
FIG. 4A illustrates $B_0$ field map measured in the brain of a subject.
FIG. 4B illustrates a targeted excitation pattern for a reduced FOV of the brain of the subject.
FIG. 4C illustrates a simulated excitation pattern initialized using extended k-t point.
FIG. 4D illustrates the simulated excitation pattern generated with an optimized RF pulse and gradient waveforms, in accordance with the present techniques.

FIGS. 4A-4D illustrate a $B_0$ field map measured in the brain (FIG. 4A), which was used in the optimization of the RF pulse and gradient waveforms for the targeted excitation pattern (FIG. 4B). This targeted excitation pattern is one that targets an ROI within the image, in particular a reduced FOV region 300 (one label for readability). Further, the process 204 in FIG. 2 is configured to determine pulse sequence parameters for the RF pulse optimized to generate the excitation pattern corresponding to the reduced FOV. The simulated excitation pattern initialized using extended k-t point is shown in FIG. 4C, and the simulated excitation pattern generated with the optimized RF pulse (e.g., from the process 204) and gradient waveforms is shown in FIG. 4D.

FIGS. 5A-5D are tissue maps for $T_1$ tissue property under different conditions, and FIGS. 5E-5H are tissue maps for $T_2$ tissue property under corresponding conditions, in accordance with an example. FIGS. 5A and 5E are $T_1$ and $T_2$ maps (respectively) excited with normal full FOV RF pulses. FIGS. 5B and 5F are $T_1$ and $T_2$ maps (respectively) excited with the 3D tailored RF pulses corresponding to a reduced FOV 400. The tissue maps of FIGS. 5B and 5F are examples of tissue property maps generated at the process 212, for example. FIGS. 5C and 5G are difference maps of the respective reduced FOV maps of FIGS. 5B and 5F removed from the full FOV maps of FIGS. 5A and 5E (respectively), where these distance maps have been rescaled by a factor of 10 to amplify the difference. The difference maps demonstrate that the $T_1$ and $T_2$ measurements with the 3D tailored RF pulse are close to the results from the conventional MRF. The differences in the $T_1$ and $T_2$ maps are mainly confined to the cerebrospinal fluid, which is likely due to physiological fluctuation. A $T_1$ value of 700 ms was used to segment reduced FOV region. FIGS. 5D and 5H provide another example of tissue maps generated by the process 212, in particular where the reduced FOV tissue map data has been segmented out from the rest of full FOV and respective $T_1$ and $T_2$ thresholds have been applied to further enhance the displayed image data for tissue assessment by a medical professional.

Figure 6:
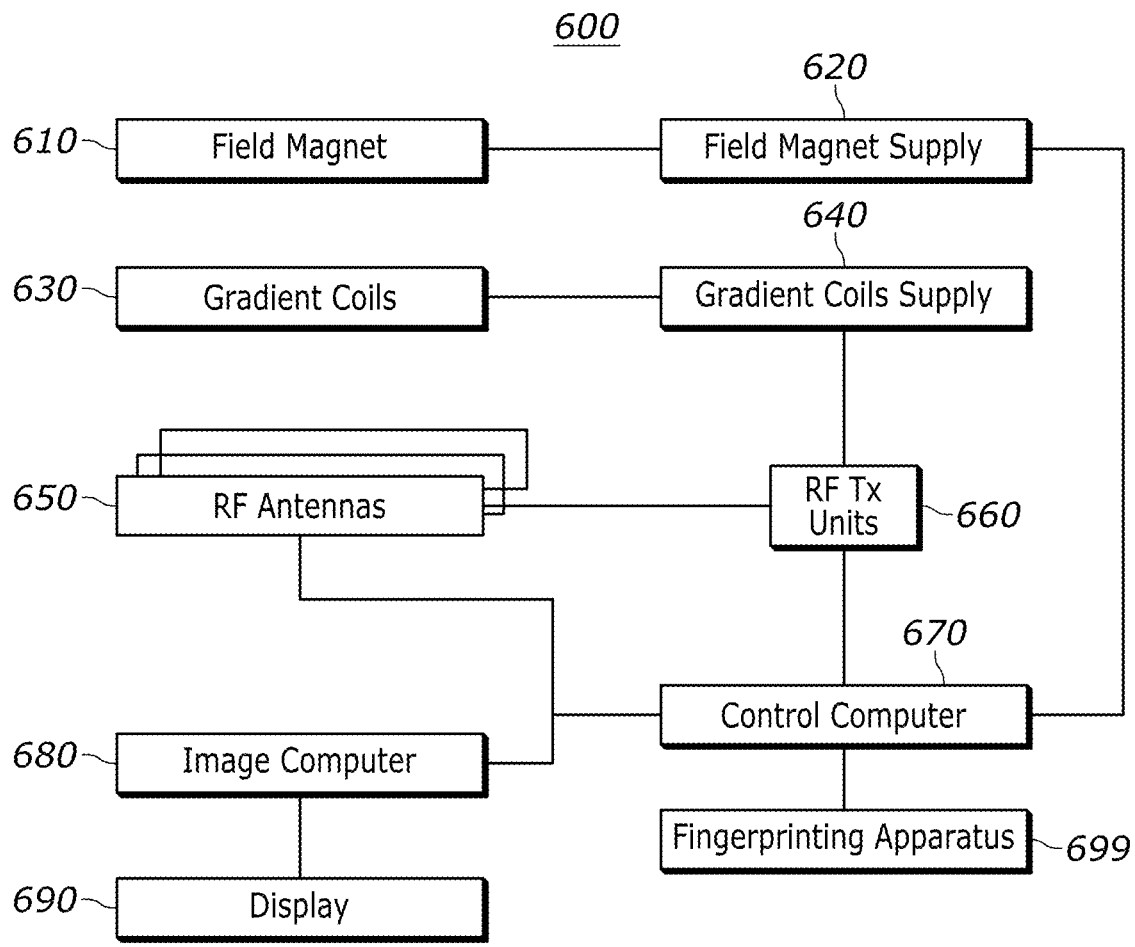
FIG. 6 illustrates an example MRF system which may include the MRF processing device of FIG. 1A and in which the techniques of FIG. 2 may be implemented, in accordance with an example.

FIG. 6 illustrates an example of a magnetic resonance scanning device in the form of a MRF system 600. The MRF system 600 may be implemented with the MRF processing device 100 of FIG. 1A as a fingerprinting apparatus 699 to facilitate the various processes and methods described herein, including the reduced FOV tailored tissue analysis. That is, depending on the implementation, the fingerprinting apparatus 699 is and/or includes elements of MRF processing device 100 as described with regard to FIG. 1A above. In further implementations, the fingerprinting apparatus 699 performs example methods such as example method 200 as described above. While fingerprinting apparatus 699 is illustrated as part of MRF system 600 in one example, fingerprinting apparatus 699 may be a separate apparatus or apparatuses.

The system 600 includes one or more field magnets 610 and a field magnet supply 620. In some implementations, the field magnets 610 produce a uniform $B_0$ field—i.e. the main static magnetic field of the MRF system 600. However, in other implementations, the $B_0$ field is not uniform. In such implementations, the magnetic field instead varies over an object that the MRF system 600 analyzes. MRF system 600 further includes gradient coils 630 configured to emit gradient magnetic fields. The gradient coils 630 may be controlled, at least in part, by a gradient coil supply 640. In some implementations, the timing, strength, and orientation of the gradient magnetic fields may be controlled, and thus selectively adapted, during an MR procedure.

Further, the MRF system 600 includes a set of RF antennas 650 that generate RF pulses, including tailored reduced FOV RF pulses as described herein, and receive resulting MR signals from an object that the MRF system 600 scans—i.e., the object to which the RF antennas 650 direct the RF pulses. In accordance with the processes and methods herein, the MRF system 600 controls how the RF pulses are generated and how the resulting MR signals are received, in particular by establishing RF pulses with pulse sequence parameters tailored to scan a reduced FOV corresponding to a particular ROI in a sample. In some examples, multiple different RF pulses are used each tailored to scan a different reduced FOV and each having different pulse sequence parameters. As such, the MRF system 600 may selectively adapt both operations during an MR procedure. In some implementations, the RF antennas 650 employs separate RF transmission and reception coils. Similarly, the RF antennas 650 may be controlled at least in part by a set of RF transmission units 660.

In some implementations, a control computer 670 controls some or all of the field magnet supply 620, the gradient coils supply 640, and/or the RF transmission units 660. That is, the control computer 670 may execute instructions received from the fingerprinting apparatus 699. In some examples, the control computer 670 is implemented within the fingerprinting apparatus 69. In further implementations, the control computer 670 is further programmed to control an MR device such as MRF processing device 500. In other implementations, control computer 670 is or includes elements of MRF processing device 500. Conventionally, the MRF system 600 employs the MR signals received from the RF antennas 650 to generate an MRF image, and thus may be subject to a transformation process. In some implementations, the transformation process is or is akin to a two dimensional fast Fourier transform (FFT) that generates pixilated image data. Depending on the implementation, an image computer 680 may perform the transformation. In other implementations, another, similar processing device performs the image transformation. Depending on the implementation, the display 690 may then display the image data. In some implementations, the display 690 may display some or all of the plots described with regard to FIGS. 3A-3C, 4A-4D, and 5a-5H above. For example, the display 690 may display any of the images, plots, etc. generated by the process 200, by the MRF processing device 100, or otherwise described herein.

While FIG. 6 illustrates an example MRF system 600 that includes various components connected in various ways, one skilled in the art will appreciate that other MR systems may include other components connected in other ways.

In the foregoing specification, specific examples have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. Additionally, the described embodiments/examples/implementations should not be interpreted as mutually exclusive, and should instead be understood as potentially combinable if such combinations are permissive in any way. In other words, any feature disclosed in any of the aforementioned embodiments/examples/implementations may be included in any of the other aforementioned embodiments/examples/implementations.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some examples may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

Moreover, the patent claims at the end of this patent application are not intended to be construed under 35 U.S.C. § 112(f) unless traditional means-plus-function language is expressly recited, such as "means for" or "step for" language being explicitly recited in the claim(s). The systems and methods described herein are directed to an improvement to computer functionality, and improve the functioning of conventional computers.

What is claimed:

1. A method for performing magnetic resonance fingerprinting (MRF), the method comprising:
    obtaining, using a magnetic resonance scanning device, a first magnetic resonance data over a main field-of-view and resulting from provision of a first magnetic resonance fingerprinting pulse sequence to a sample, the first magnetic resonance fingerprinting pulse comprising a first radio frequency (RF) pulse and gradient waveform pair;
    obtaining, using the magnetic resonance scanning device, a second magnetic resonance data over the main field-of-view and resulting from provision of a second magnetic resonance fingerprinting pulse sequence comprising a second RF pulse and gradient waveform pair having different pulse sequence parameters compared to the first magnetic resonance fingerprinting pulse;
comparing, using the magnetic resonance scanning device, the first magnetic resonance data and the second magnetic resonance data to a fingerprint dictionary of signal profiles, wherein the fingerprint dictionary includes one or more of: (i) a previously acquired magnetic resonance fingerprint signal evolution, or (ii) a simulated magnetic resonance fingerprint signal evolution, and corresponds to the signal acquired from a material in a reduced field-of-view; and
responsive to the comparison, generating, using the magnetic resonance scanning device, high-resolution tissue property maps of the portion of the sample corresponding to the reduced field-of-view for display to a user.

2. A non-transitory computer-readable storage medium storing executable instructions that, when executed by a processor, cause a computer to:
obtain, using a magnetic resonance scanning device, a first magnetic resonance data over a main field-of-view and resulting from provision of a first magnetic resonance fingerprinting pulse sequence to a sample, the first magnetic resonance fingerprinting pulse comprising a first radio frequency (RF) pulse and gradient waveform pair,
obtain, using the magnetic resonance scanning device, a second magnetic resonance data over the main field-of-view and resulting from provision of a second magnetic resonance fingerprinting pulse sequence comprising a second RF pulse and gradient waveform pair having different pulse sequence parameters compared to the first magnetic resonance fingerprinting pulse;
compare, using the magnetic resonance scanning device, the first magnetic resonance data and the second magnetic resonance data to a fingerprint dictionary of signal profiles, wherein the fingerprint dictionary includes one or more of: (i) a previously acquired magnetic resonance fingerprint signal evolution, or (ii) a simulated magnetic resonance fingerprint signal evolution, and corresponds to the signal acquired from a material in a reduced field-of-view; and
responsive to the comparison, generate, using the magnetic resonance scanning device, high-resolution tissue property maps of the portion of the sample corresponding to the reduced field-of-view for display to a user.

3. The method of claim 1, wherein the different pulse sequence parameters comprise different RF pulse parameters selected from the group consisting of flip angles, RF pulse magnitude, RF pulse phase, RF pulse waveform, and gradient waveform.

4. The method of claim 1, wherein generating high-resolution tissue property maps of the portion of the sample corresponding to the reduced field-of-view comprises generating a $T_1$ tissue property map and a $T_2$ tissue property map corresponding to the reduced field-of-view.

5. The method of claim 1, further comprising:
comparing, using the magnetic resonance scanning device, the first magnetic resonance data and the second magnetic resonance data to a fingerprint dictionary of signal profiles corresponding to a region of the main field-of-view outside of the reduced field-of-view; and
responsive to the comparison, generating, using the magnetic resonance scanning device, high-resolution tissue property maps of the portion of the sample corresponding to the region of the main field-of-view outside of the reduced field-of-view.

6. The method of claim 1, further comprising:
applying, using the magnetic resonance scanning device, the first magnetic resonance fingerprinting pulse sequence to the sample to affect acquiring the sequence of first magnetic resonance data; and
applying, using the magnetic resonance scanning device, the second magnetic resonance fingerprinting pulse sequence to the sample to affect acquiring the sequence of second magnetic resonance data.

7. The method of claim 1, the method comprising:
obtaining an identification of the reduced field-of-view of the main field-of-view from analysis of previously-obtained data corresponding to the main field-of-view.

8. The method of claim 1, the method comprising:
displaying a visual indication of the main field-of-view of the sample to a user; and
obtaining, from the user, an identification of the reduced field-of-view of the main field-of-view.

9. The non-transitory computer-readable storage medium of claim 2, wherein the different pulse sequence parameters comprise different RF pulse parameters selected from the group consisting of flip angles, RF pulse magnitude, RF pulse phase, RF pulse waveform, and gradient waveform.

10. The non-transitory computer-readable storage medium of claim 2, storing executable instructions that, when executed by a processor, cause a computer to:
generate the high-resolution tissue property maps of the portion of the sample corresponding to the reduced field-of-view as a $T_1$ tissue property map and a $T_2$ tissue property map corresponding to the reduced field-of-view.

11. The non-transitory computer-readable storage medium of claim 2, storing executable instructions that, when executed by a processor, cause a computer to:
compare, using the magnetic resonance scanning device, the first magnetic resonance data and the second magnetic resonance data to a fingerprint dictionary of signal profiles corresponding to a region of the main field-of-view outside of the reduced field-of-view; and
responsive to the comparison, generate, using the magnetic resonance scanning device, high-resolution tissue property maps of the portion of the sample corresponding to the region of the main field-of-view outside of the reduced field-of-view.

12. The non-transitory computer-readable storage medium of claim 2, storing executable instructions that, when executed by a processor, cause a computer to:
apply, using the magnetic resonance scanning device, the first magnetic resonance fingerprinting pulse sequence to the sample to affect acquiring the sequence of first magnetic resonance data; and
apply, using the magnetic resonance scanning device, the second magnetic resonance fingerprinting pulse sequence to the sample to affect acquiring the sequence of second magnetic resonance data.

13. The non-transitory computer-readable storage medium of claim 2, storing executable instructions that, when executed by a processor, cause a computer to:
obtain an identification of the reduced field-of-view of the main field-of-view from analysis of previously-obtained data corresponding to the main field-of-view.

14. The non-transitory computer-readable storage medium of claim 9, storing executable instructions that, when executed by a processor, cause a computer to:
display a visual indication of the main field-of-view of the sample to a user; and
obtain, from the user, an identification of the reduced field-of-view of the main field-of-view.

15. The non-transitory computer-readable storage medium of claim 2, wherein the simulated magnetic resonance fingerprint signal evolution corresponding to the signal acquired from the material in the reduced field-of-view is in response to the first and second magnetic resonance fingerprinting pulse sequences.

16. The method of claim 1, wherein the simulated magnetic resonance fingerprint signal evolution corresponding to the signal acquired from the material in the reduced field-of-view is in response to the first and second magnetic resonance fingerprinting pulse sequences.

17. The method of claim 5, wherein generating high-resolution tissue property maps of the portion of the sample corresponding to the region of the main field-of-view outside of the reduced field-of-view comprises generating $T_1$ tissue property maps and $T_2$ tissue property maps corresponding to the corresponding to the region of the main field-of-view outside of the reduced field-of-view.

18. The non-transitory computer-readable storage medium of claim 11, wherein the high-resolution tissue property maps of the portion of the sample corresponding to the region of the main field-of-view outside of the reduced field-of-view comprise a $T_1$ tissue property map and a $T_2$ tissue property map corresponding to the corresponding to the region of the main field-of-view outside of the reduced field-of-view.

* * * * *